United States Patent
Yeh

(10) Patent No.: US 8,653,546 B2
(45) Date of Patent: Feb. 18, 2014

(54) LIGHT-EMITTING DEVICE HAVING A RAMP

(75) Inventor: Jui-Hung Yeh, Hsinchu (TW)

(73) Assignee: Epistar Corporation, Hsinchu (TW)

(*) Notice: Subject to any disclaimer, the term of this patent is extended or adjusted under 35 U.S.C. 154(b) by 0 days.

(21) Appl. No.: 12/899,535

(22) Filed: Oct. 6, 2010

(65) Prior Publication Data

US 2011/0316023 A1 Dec. 29, 2011

(30) Foreign Application Priority Data

Oct. 6, 2009 (TW) .............................. 98133926 A
Oct. 23, 2009 (CN) ........................ 2009 1 02070120

(51) Int. Cl.
*H01L 33/00* (2010.01)

(52) U.S. Cl.
USPC ............................................. 257/95; 257/98

(58) Field of Classification Search
USPC ..................................................... 257/95, 98
See application file for complete search history.

(56) References Cited

U.S. PATENT DOCUMENTS

| 7,205,573 | B2 | 4/2007 | Liu et al. | |
|---|---|---|---|---|
| 7,915,621 | B2* | 3/2011 | Hasnain ........................... | 257/80 |
| 2006/0202219 | A1* | 9/2006 | Ohashi et al. ................... | 257/98 |
| 2010/0159622 | A1* | 6/2010 | Hsieh et al. ..................... | 438/29 |
| 2010/0308365 | A1* | 12/2010 | Masuya et al. .................. | 257/98 |

FOREIGN PATENT DOCUMENTS

| CN | 101436632 | | 5/2009 |
|---|---|---|---|
| JP | 1995022648 | | 1/1995 |
| KR | 2006101601 A | * | 9/2006 |

* cited by examiner

*Primary Examiner* — David Vu
*Assistant Examiner* — Brandon Fox
(74) *Attorney, Agent, or Firm* — Patterson & Sheridan, LLP

(57) ABSTRACT

A light-emitting device includes a light-emitting stacked layer having an active layer, and a composite substrate located under the light-emitting stacked layer. The composite substrate includes a supportive substrate having a top surface and a bottom surface non-parallel to the active layer; a metal substrate located under the supportive substrate; and a reflective layer located between the supportive substrate and the metal substrate.

20 Claims, 5 Drawing Sheets

2

US 8,653,546 B2

LIGHT-EMITTING DEVICE HAVING A RAMP

TECHNICAL FIELD

The application relates to a light-emitting element, and more particularly to a light-emitting element having a ramp.

REFERENCE TO RELATED APPLICATION

This application claims the right of priority based on TW application Ser. No. 098133926, filed "Oct. 6, 2009", and the contents of which are incorporated herein by reference in its entirety.

DESCRIPTION OF BACKGROUND ART

Light-emitting Diode (LED) is a solid state semiconductor element comprising a p-n junction formed between a p-type semiconductor layer and an n-type semiconductor layer. When imposing a certain level of forward voltage to the p-n junction, holes from the p-type semiconductor layer and electrons from the n-type semiconductor layer are combined to release light. The region for light releasing is generally called light-emitting region.

The primary features of an LED include its small size, excellent CRI, high reliability, high efficiency, long life, and short initial illumination time. So far, LEDs have been applied to electronic devices, vehicles, signboards, and traffic signs. Along with the launch of the full-color LED, LED has gradually replaced traditional lighting apparatus such as fluorescent lights and incandescent lamps.

Each of the foregoing LED can be further connected to a submount via a substrate of the foregoing LED and solders or adhesive elements. Moreover, the submount includes at least a circuit to be electrically connected with a contact of a light-emitting device or a light-absorbing device via a conductive structure such as wire lines.

SUMMARY OF THE DISCLOSURE

A wafer contains a light-emitting element including a supportive substrate; a transparent bonding layer formed on the supportive substrate; and a light-emitting stacked layer formed on the transparent bonding layer. The light-emitting stacked layer includes a first semiconductor layer; an active layer formed on the first semiconductor layer; and a second semiconductor layer formed on the active layer; wherein there are a first electrode and a second electrode formed on the first semiconductor layer and the second semiconductor layer respectively. A part of the supportive substrate is removed from the bottom plane thereof to form a first bottom surface which is not parallel to the active layer. There is a first included angle between the first bottom surface and a top surface of the supportive substrate, wherein the first included angle is about 20°~70°. A reflective layer is formed under the first bottom surface, and a metal substrate is formed under the reflective layer wherein the metal substrate does not directly contact with the supportive substrate.

A second embodiment of the present application contains the supportive substrate including a first bottom surface and a second bottom surface. The first bottom surface connects with the second bottom surface at a top surface of the supportive substrate. There are a first included angle between the top surface and the first bottom surface and a second included angle between the top surface and the second bottom surface respectively.

A third embodiment of the present application contains the supportive substrate including a first bottom surface and a second bottom surface wherein the first bottom surface contacts with the second bottom surface at the bottom plane of the metal substrate.

A forth embodiment of the present application contains the supportive substrate including a concave bottom surface.

A fifth embodiment of the present application contains the supportive substrate including a convex bottom surface.

DETAILED DESCRIPTION OF PREFERRED EMBODIMENTS

The embodiments of present application will be described in detail and sketched in figures. The same or similar parts will be shown with the same numbers in every figure and the specification.

Figure 1:
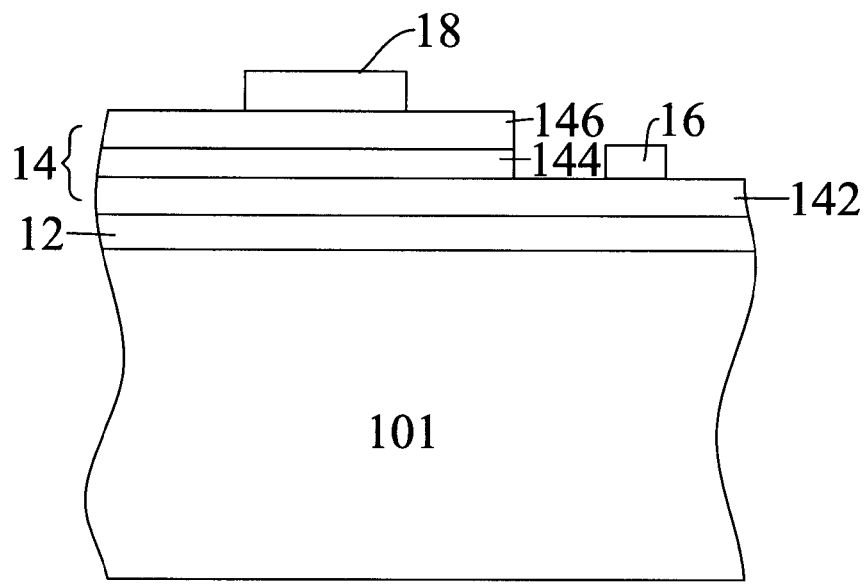
FIGS. 1-4 illustrate a flow chart of manufacturing process in accordance with a first embodiment of the present application.
Figure 2:
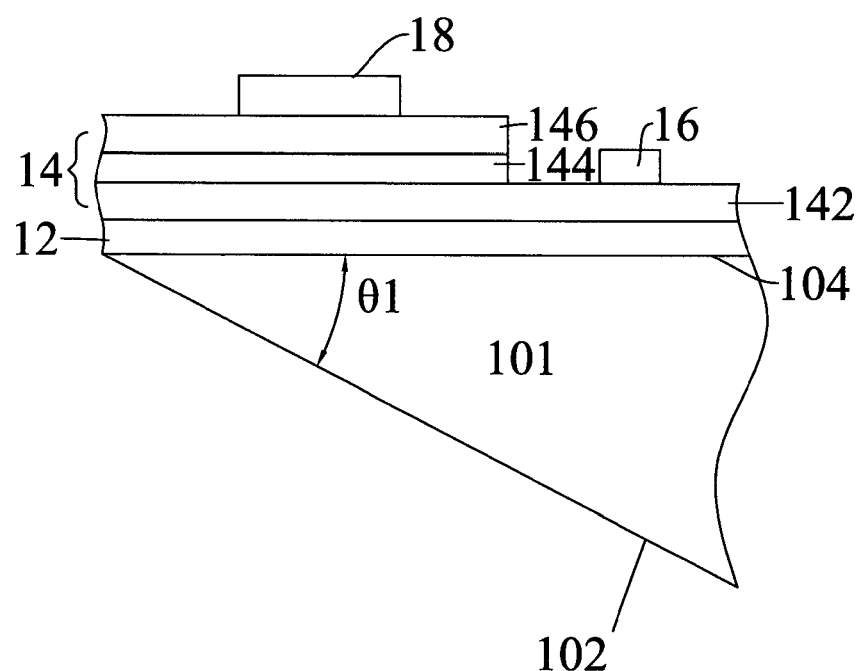
Figure 3:
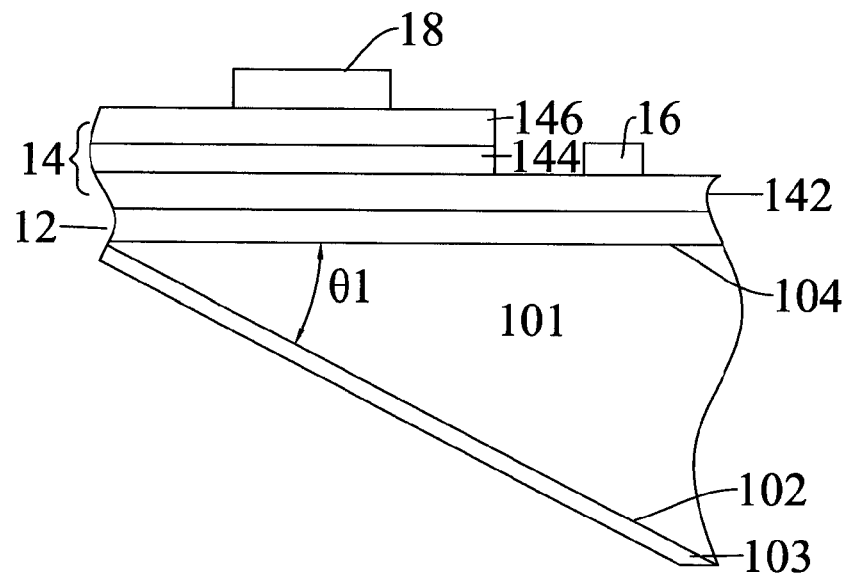
Figure 4:
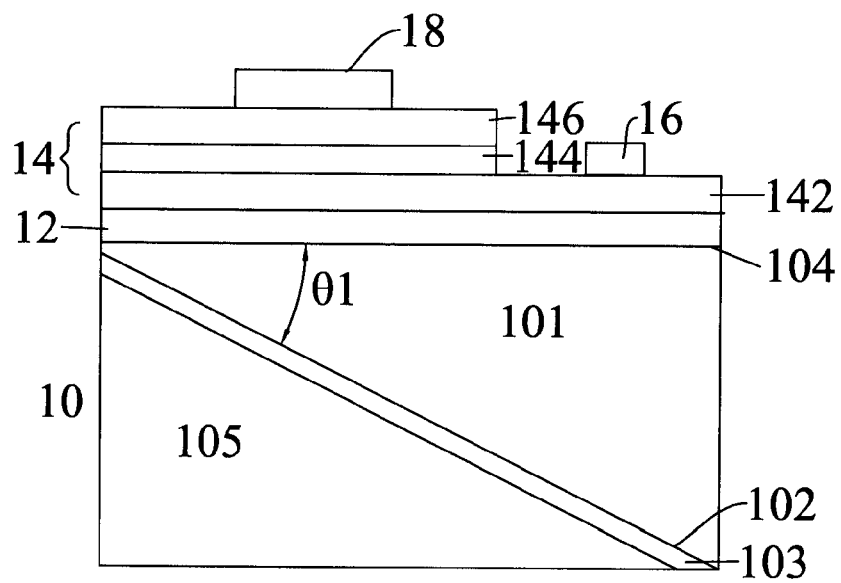

FIGS. 1-4 are the flow chart of the manufacturing process of a first embodiment. As FIG. 1 shows, a wafer contains a light-emitting element including a supportive substrate 101; a transparent bonding layer 12 formed on the supportive substrate 110; and a light-emitting stacked layer 14 formed on the transparent bonding layer 12. The light-emitting stacked layer 14 includes a first semiconductor layer 142; an active layer 144 formed on the first semiconductor layer 142; and a second semiconductor layer 146 formed on the active layer 144, wherein there are a first electrode 16 and a second electrode 18 formed on the first semiconductor layer 142 and the second semiconductor layer 146 respectively. A part of the supportive substrate 101 is removed from the bottom plane thereof to form a first bottom surface 102 which is not parallel to the active layer 144 and can be a ramp, for instance, as shown in FIG. 2. The method of removing the part of the supportive substrate 101 includes etching or laser-lift off. There is a first included angle $\theta_1$ between the first bottom surface 102 and a top surface 104 of the supportive substrate 101, and the first included angle is $\theta_1$ about 20°~70°. As FIG. 3 shows, a reflective layer 103 is formed under the first bottom surface 102. The method of forming the reflective layer 13 includes evaporation, sputtering, or bonding. A metal substrate 105 is formed under the reflective layer 103, wherein the metal substrate 105 does not directly contact with the supportive substrate 101. The method of forming the metal substrate 105 includes plating. The extrusive parts (not shown) of the metal substrate 105 is removed by etching or polishing. The wafer containing a light-emitting element is diced to form a light-emitting element chip 1 as shown in FIG.

4, wherein a composite substrate 10 includes the supportive substrate 101, the metal substrate 105, and the reflective layer 103 which is formed between the supportive substrate 101 and the metal substrate 105.

The supportive substrate 101 can be the growth substrate for the growth of the light-emitting stacked layer 14, or the substrate where the light-emitting stacked layer is bonded by the transparent bonding layer 12. The supportive substrate 101 can support the light-emitting stacked layer 14 thereon. The material of the supportive substrate 101 can be insulating material such as Sapphire, Diamond, Glass, Quartz, Acryl, ZnO, or AlN. The supportive substrate 101 can be transparent substrate and can be conductive or insulative. The supportive substrate 101 includes the first bottom surface 102 which is not parallel to the active layer 144, such as a ramp in this embodiment. The reflective layer 103 can reflect the light generated from the light-emitting stacked layer 14 toward a side of the light-emitting element 1 and to be extracted there to improve the light extraction efficiency. In addition, the first bottom surface 102 can be designed to reflect the light toward other sides for the application. The material of the reflective layer 103 can be metal or the material of high reflectivity such as Cu, Al, In, Sn, Au, Pt, Zn, Ag, Ti, Pb, Pd, Ge, Ni, Cr, Cd, Co, Mn, Sb, Bi, Ga, Tl, As, Se, Te, Po, Ir, Re, Rh, Os, W, Li, Na, K, Be, Mg, Ca, Sr, Ba, Zr, Mo, La, Cu—Sn, Cu—Zn, Cu—Cd, Sn—Pb—Sb, Sn—Pb—Zn, Ni—Sn, Ni—Co, or Au alloy. The reflective layer 103 can also include a Distributed Bragg Reflector (DBR). The material of the DBR can be transparent material such as Polyimide, BCB, PFCB, ITO, MgO, Su8, Epoxy, Acrylic Resin, COC, PMMA, PET, PC, Polyetherimide, Fluorocarbon Polymer, Silicone, Glass, $Al_2O_3$, $SiO_2$, $TiO_2$, $SiN_x$, or SOG. The metal substrate 105 can support the supportive substrate 101 and the light-emitting stacked layer 14 and dissipate heat. The material of the metal substrate 105 can be metal material such as Cu, Al, In, Sn, Au, Pt, Zn, Ag, Ti, Pb, Pd, Ge, Ni, Cr, Cd, Co, Mn, Sb, Bi, Ga, Tl, As, Se, Te, Po, Ir, Re, Rh, Os, W, Li, Na, K, Be, Mg, Ca, Sr, Ba, Zr, Mo, La, Cu—Sn, Cu—Zn, Cu—Cd, Sn—Pb—Sb, Sn—Pb—Zn, Ni—Sn, Ni—Co, Au alloy, InAg, InAu, AuBe, AuGe, AuZn, PbSn, PdIn, or AuSn.

The transparent bonding layer 12 can be electrically conductive or insulative and connect the supportive substrate 101 with the light-emitting stacked layer 14. The material of the transparent bonding layer 12 can be transparent material such as Polyimide, BCB, PFCB, ITO, MgO, Sub, Epoxy, Acrylic Resin, COC, PMMA, PET, PC, Polyetherimide, Fluorocarbon Polymer, Silicone, Glass, $Al_2O_3$, $SiO_2$, $TiO_2$, $SiN_x$, SOG, ITO, InO, SnO, CTO, ATO, AZO, ZTO, ZnO, AlGaAs, GaN, GaP, GaAs, or GaAsP. The material of the light-emitting stacked layer 14 includes more than one element selected from the group consisting of Ga, Al, In, P, N, Zn, Cd, and Se. The polarity of the first semiconductor layer 142 and the second semiconductor layer 146 is different.

Figure 5:
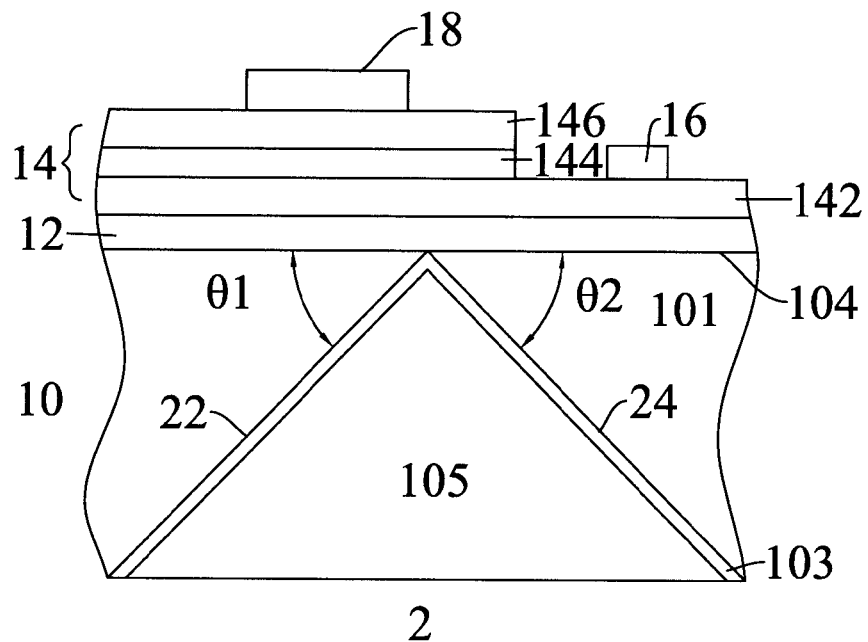
FIG. 5 illustrates a cross-sectional view in accordance with a second embodiment of the present application.
Figure 6:
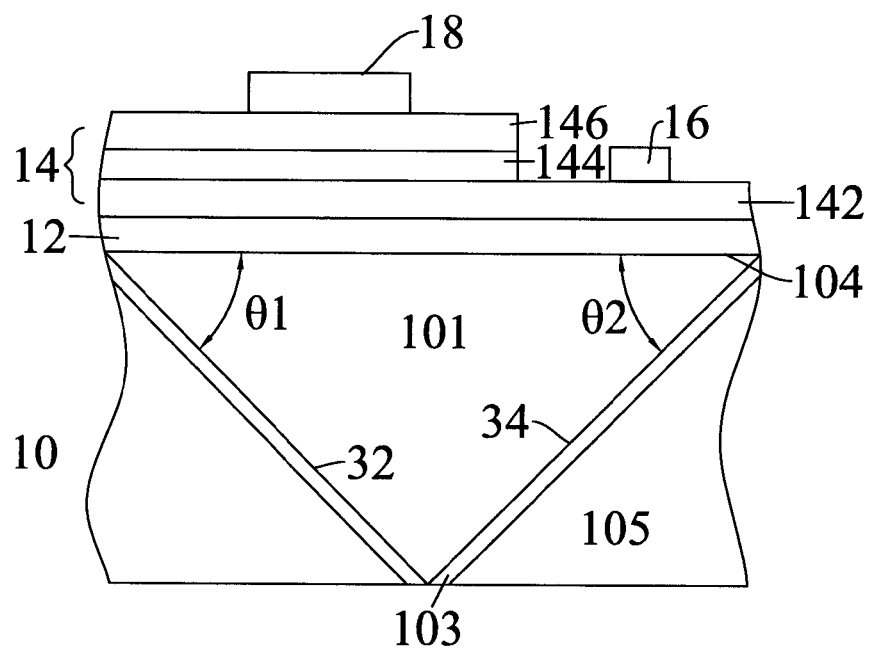
FIG. 6 illustrates a cross-sectional view in accordance with a third embodiment of the present application.

As FIG. 5 shows, a second embodiment of the present application contains the supportive substrate 101 including a first bottom surface 22 and a second bottom surface 24. The metal substrate 105 is formed under the first bottom surface 22 and the second bottom surface 24. The first bottom surface 22 is connected with the second bottom surface 24 at the top surface 104. There are a first included angle $\theta_1$ and a second included angle $\theta_2$ between the first bottom surface 22 and the top surface 104 and between the second bottom surface 24 and the top surface 104 respectively. The first included angle $\theta_1$ or a second included angle $\theta_2$ is about 20°~70°respectively, and the angles of the first included angle $\theta_1$ or a second included angle $\theta_2$ can be the same or not. As FIG. 6 shows, a third embodiment of the present application includes the first bottom surface 22 connected with the second bottom surface 24 at the bottom plane of the metal substrate 105. There are the first included angle $\theta_1$ and the second included angle $\theta_2$ between the first bottom surface 22 and the top surface 104 and between the second bottom surface 24 and the top surface 104 respectively. The first included angle $\theta_1$ or a second included angle $\theta_2$ is about 20°~70° respectively, and the angles of the first included angle $\theta_1$ or a second included angle $\theta_2$ can be the same or not.

Figure 7:
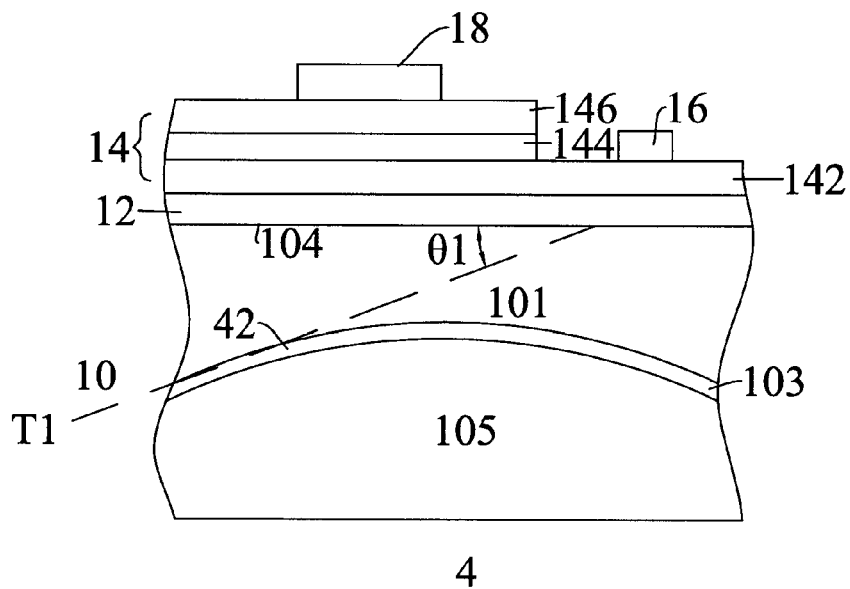
FIG. 7 illustrates a cross-sectional view in accordance with a forth embodiment of the present application.
Figure 8:
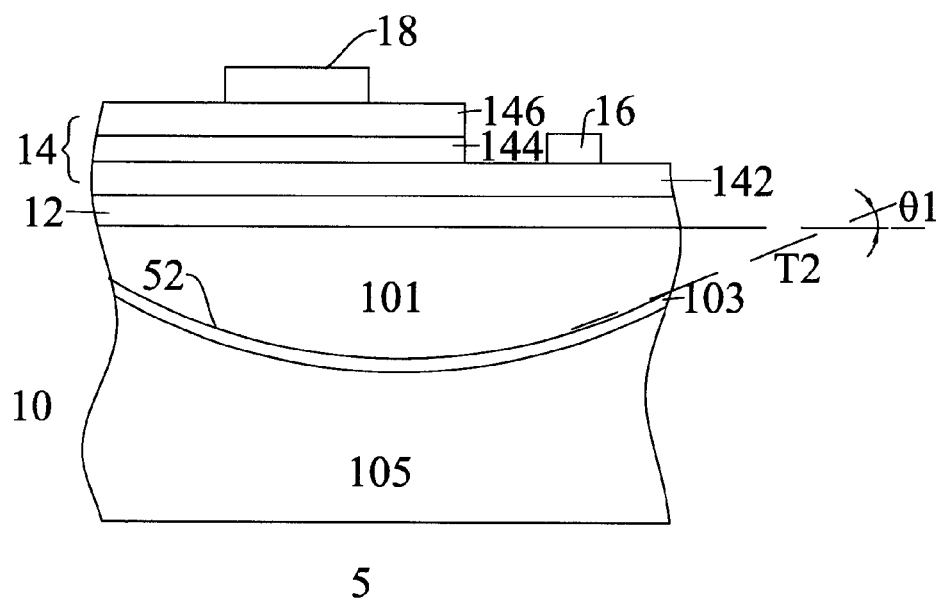
FIG. 8 illustrates a cross-sectional view in accordance with a fifth embodiment of the present application.

As FIG. 7 shows, a forth embodiment of the present application contains the supportive substrate 101 including a concave bottom surface 42. There is a first included angle $\theta_1$ between a tangent line T1 of a lateral side of the concave bottom surface 42 and the top surface 104. The first included angle $\theta_1$ is about 20°~70°. As FIG. 8 shows, a fifth embodiment of the present application contains the supportive substrate 101 including a convex bottom surface 52. There is a first included angle $\theta_1$ between a tangent line T2 of a lateral side of the convex bottom surface 52 and the top surface 104. The first included angle $\theta_1$ is about 20°~70°.

Figure 9:
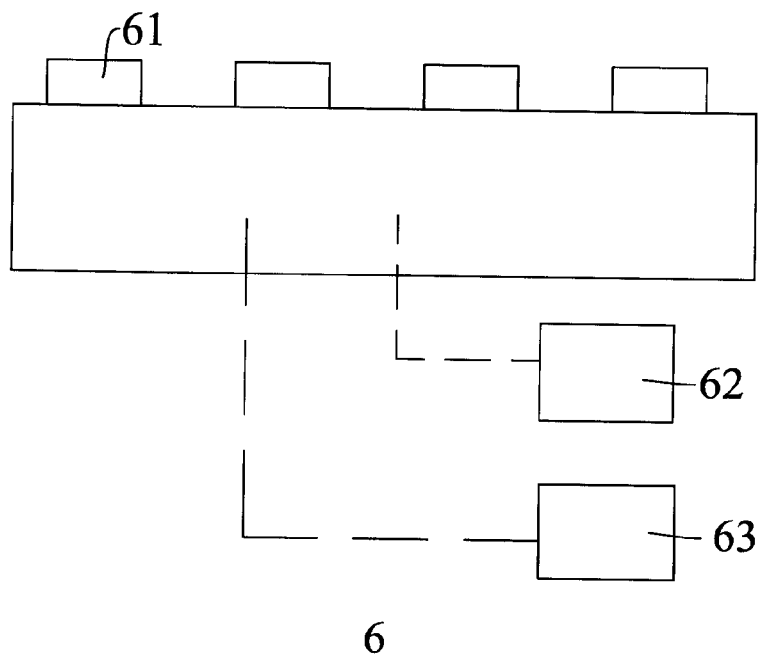
FIG. 9 illustrates a schematic diagram of a light-generating device adopting a light-emitting element as any one of the embodiments of present application.

FIG. 9 illustrates a diagram of a light-generating device. A light-generating device 6 includes a chip manufactured by a wafer containing the light-emitting element of any one of the embodiments of the present application. A light-generating device 6 can be an illumination device such as a street light, a lamp of vehicle, or an illustration source for interior. The light-generating device 6 can be also a traffic sign, or a backlight of a backlight module of an LCD. The light-generating device 6 includes a light source 61 adopting the foregoing light-emitting element; a power supplying system 62 providing current to the light source 61; and a control element 63 controlling the power supplying system 62.

Figure 10:
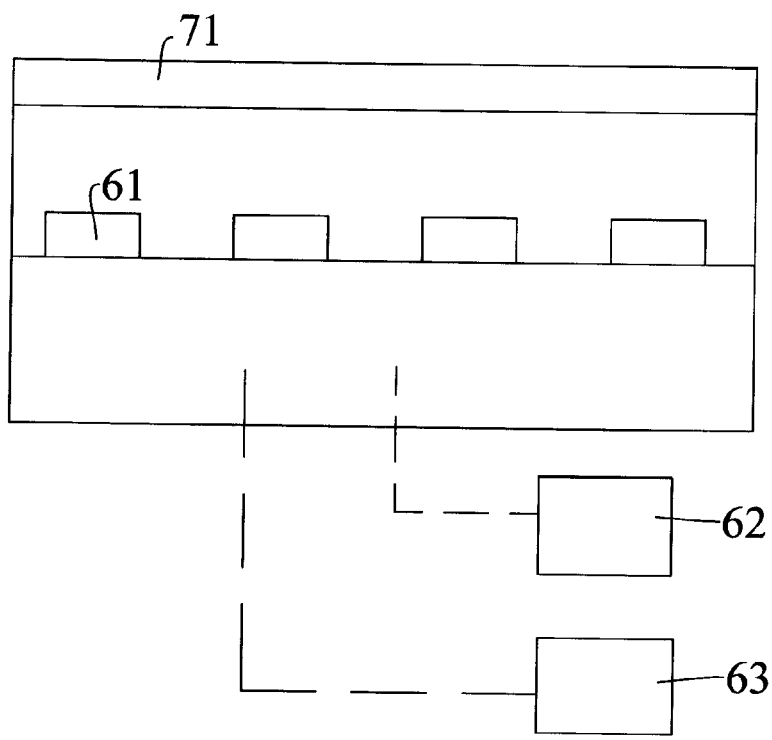
FIG. 10 illustrates a schematic diagram of a backlight module adopting a light-emitting element as any one of the embodiments of present application.

FIG. 10 illustrates a cross-sectional schematic diagram of a back light module 7. A back light module 7 includes the light-generating device 6 of the foregoing embodiment and an optical element 71. The optical element 71 can process the light generated by the light-generating device 6 for LCD application, such as scattering the light emitted from the light-generating device 6.

Although the present application has been explained above, it is not the limitation of the range, the sequence in practice, the material in practice, or the method in practice. Any modification or decoration for present application is not detached from the spirit and the range of such.

What is claimed is:

1. A light-emitting element, comprising:
   a light-emitting stacked layer, comprising an active layer; and
   a composite substrate formed under the light-emitting stacked layer, comprising:
   a supportive substrate, comprising an insulating material, top surface and a first bottom surface not parallel to the active layer;
   a metal substrate formed under the supportive substrate; and
   a reflective layer formed between the supportive substrate and the metal substrate.

2. The light-emitting element of claim 1, wherein the metal substrate comprises a material selected from a group consisting of Cu, Al, In, Sn, Au, Pt, Zn, Ag, Ti, Pb, Pd, Ge, Ni, Cr, Cd, Co, Mn, Sb, Bi, Ga, Tl, As, Se, Te, Po, Ir, Re, Rh, Os, W, Li, Na, K, Be, Mg, Ca, Sr, Ba, Zr, Mo, La, Cu—Sn, Cu—Zn, Cu—Cd, Sn—Pb—Sb, Sn—Pb—Zn, Ni—Sn, Ni—Co, Au alloy, InAg, InAu, AuBe, AuGe, AuZn, PbSn, PdIn, and AuSn.

3. The light-emitting element of claim 1, wherein the supportive substrate comprises a material selected from a group consisting of Sapphire, Diamond, Glass, Quartz, Acryl, ZnO, and AlN.

4. The light-emitting element of claim 1, wherein the reflective layer comprises a material selected from a group consisting of Cu, Al, In, Sn, Au, Pt, Zn, Ag, Ti, Pb, Pd, Ge, Ni, Cr, Cd, Co, Mn, Sb, Bi, Ga, Tl, As, Se, Te, Po, Ir, Re, Rh, Os, W, Li, Na, K, Be, Mg, Ca, Sr, Ba, Zr Mo, La, Cu—Sn, Cu—Zn, Cu—Cd, Sn—Pb—Sb, Sn—Pb—Zn, Ni—Sn, Ni—Co, and Au alloy.

5. The light-emitting element of claim 1, wherein the reflective layer comprises a DBR.

6. The light-emitting element of claim 5, wherein the DBR comprises a material selected from a group consisting of Polyimide, BCB, PFCB, ITO, MgO, Su8, Epoxy, Acrylic Resin, COC, PMMA, PET, PC, Polyetherimide, Fluorocarbon Polymer, Silicone, Glass, $Al_2O_3$, $SiO_2$, $TiO_2$, $SiN_x$, and SOG.

7. The light-emitting element of claim 1, wherein the light-emitting stacked layer further comprises;
a first semiconductor layer formed between the composite substrate and the active layer; and
a second semiconductor layer formed on the active layer.

8. The light-emitting element of claim 1, wherein the light-emitting stacked layer comprises more than one element selected from the group consisting of Ga, Al, In, P, N, Zn, Cd, and Se.

9. The light-emitting element of claim 1 further comprising a transparent bonding layer formed between the light-emitting stacked layer and the composite substrate.

10. The light-emitting element of claim 9, wherein the transparent bonding layer comprises a material selected from a group consisting of Polyimide, BCB, PFCB, ITO, MgO, Su8, Epoxy, Acrylic Resin, COG, PMMA, PET, PC, Polyetherimide, Fluorocarbon Polymer, Silicone, Glass, $Al_2O_3$, $SiO_2$, $TiO_2$, $SiN_x$, SOG, ITO, InO, SnO, CTO, ATO, AZO, ZTO, ZnO, AlGaAs, GaN, GaP, GaAs, and GaAsP.

11. The light-emitting element of claim 9, wherein the transparent bonding layer is electrically insulative.

12. The light-emitting element of claim 1, wherein there is a first included angle between the top surface and the first bottom surface and the first included angle is 20°~70°.

13. The light-emitting element of claim 1, wherein the supportive substrate further comprises a second bottom surface, and there is a second included angle between the top surface and the second bottom surface and the second included angle is 20°~70°.

14. The light-emitting element of claim 1, wherein the first bottom surface is a convex bottom surface.

15. The light-emitting element of claim 14, wherein a first included angle is between a tangent line of a lateral side of the convex bottom surface and the top surface.

16. The light-emitting element of claim 15, wherein the first included angle is about 20°~70°.

17. The light-emitting element of claim 1, wherein the first bottom surface is a concave bottom surface.

18. The light-emitting element of claim 17, wherein a first included angle is between a tangent line of a lateral side of the concave bottom surface and the top surface.

19. The light-emitting element of claim 18, wherein the first included angle is about 20α~70°.

20. The light-emitting element of claim 1, wherein the reflective layer has an end portion and a middle portion, and the end portion is closer to the top surface than the middle portion.

* * * * *